(12) United States Patent
Kim et al.

(10) Patent No.: US 8,758,981 B2
(45) Date of Patent: Jun. 24, 2014

(54) PHOTORESIST UNDERLAYER COMPOSITION AND METHOD OF MANUFACTURING SEMICONDUCTOR DEVICE BY USING THE SAME

(75) Inventors: Mi-Young Kim, Uiwang-si (KR);
Sang-Kyun Kim, Uiwang-si (KR);
Hyeon-Mo Cho, Uiwang-si (KR);
Chang-Soo Woo, Uiwang-si (KR);
Sang-Ran Koh, Uiwang-si (KR);
Hui-Chan Yun, Uiwang-si (KR);
Woo-Jin Lee, Uiwang-si (KR);
Jong-Seob Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/540,111

(22) Filed: Jul. 2, 2012

(65) Prior Publication Data
US 2012/0282776 A1 Nov. 8, 2012

Related U.S. Application Data (63) Continuation of application No. PCT/KR2010/008859, filed on Dec. 10, 2010.

(30) Foreign Application Priority Data

Dec. 31, 2009 (KR) .................. 10-2009-0136178

(51) Int. Cl.
*G03F 7/11* (2006.01)
*G03F 7/00* (2006.01)
*G03F 7/40* (2006.01)

(52) U.S. Cl.
USPC ......... 430/272.1; 430/313; 430/316; 430/319

(58) Field of Classification Search
None
See application file for complete search history.

(56) References Cited

U.S. PATENT DOCUMENTS

| 6,576,393 | B1 | 6/2003 | Sugita et al. | |
|---|---|---|---|---|
| 7,629,260 | B2 | 12/2009 | Uh et al. | |
| 2007/0224816 | A1 | 9/2007 | Uh et al. | |
| 2008/0118875 | A1 | 5/2008 | Kim et al. | |
| 2008/0305441 | A1* | 12/2008 | Yoon et al. | 430/323 |
| 2009/0148789 | A1* | 6/2009 | Amara et al. | 430/270.1 |
| 2011/0275019 | A1 | 11/2011 | Yoon et al. | |

FOREIGN PATENT DOCUMENTS

| JP | 2000-356854 A | | 12/2000 |
|---|---|---|---|
| JP | 2004059737 A | * | 2/2004 |
| JP | 2004-210922 A | | 7/2004 |
| JP | 2009-229935 A | | 10/2009 |
| KR | 10 2000-0077018 A | | 12/2000 |
| KR | 10 2007-0095736 A | | 10/2007 |
| KR | 10 2007-0122250 A | | 12/2007 |
| KR | 10-0796047 B1 | | 1/2008 |
| KR | 10 2009-0049033 A | | 5/2009 |
| TW | 200906977 | | 2/2009 |
| TW | 200937127 | | 9/2009 |

OTHER PUBLICATIONS

Machine translation JP 2004-059737. Feb. 26, 2004.*

(Continued)

*Primary Examiner* — Cynthia H Kelly
*Assistant Examiner* — Alyssa L Cepluch
(74) *Attorney, Agent, or Firm* — Lee & Morse, P.C.

(57) ABSTRACT

A photoresist underlayer composition includes a solvent, and a polysiloxane resin represented by Chemical Formula 1:

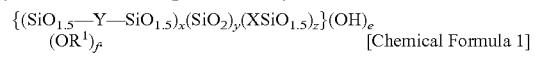

[Chemical Formula 1]

15 Claims, 2 Drawing Sheets

(56) References Cited

OTHER PUBLICATIONS

International Search Report in PCT/KR 2010/008859, dated Aug. 12, 2011 (Kim, et al.).

Taiwanese Search Report in TW 099144731, dated Apr. 25, 2013 (Kim, et al.).
Chinese Search Report in CN 2010800603846, dated Feb. 25, 2013 (Kim, et al.).

* cited by examiner

PHOTORESIST UNDERLAYER COMPOSITION AND METHOD OF MANUFACTURING SEMICONDUCTOR DEVICE BY USING THE SAME

CROSS-REFERENCE TO RELATED APPLICATIONS

This application is a continuation under 35 U.S.C. §120 of pending International Application No. PCT/KR2010/008859, entitled "Photoresist Underlayer Composition and Method of Manufacturing Semiconductor Device By Using the Same," which was filed on Dec. 10, 2010, the entire contents of which is hereby incorporated by reference.

This application claims priority under 35 U.S.C. §119 to Korean Patent Application No. 10-2009-0136178, filed on Dec. 31, 2009, in the Korean Intellectual Property Office, and entitled: "Photoresist Underlayer Composition and Method of Manufacturing Semiconductor Device By Using the Same," the entire contents of which is hereby incorporated by reference.

BACKGROUND

Embodiments relate to a photoresist underlayer composition and a method of manufacturing a semiconductor device using the same.

SUMMARY

Embodiments are directed to a photoresist underlayer composition, including a solvent, and a polysiloxane resin represented by Chemical Formula 1:

[Chemical Formula 1]

wherein, in Chemical Formula 1:
x, y, and z respectively may denote a relative ratio of a $(SiO_{1.5}-Y-SiO_{1.5})_x$ repeating unit, a $(SiO_2)_y$ repeating unit, and a $(XSiO_{1.5})_z$ repeating unit in the polysiloxane resin,
e and f respectively may denote a ratio of a —OH group and a —OR$^1$ group bonded to silicon atoms relative to a total number of silicon atoms in the polysiloxane resin, the total number of silicon atoms in the polysiloxane resin may be 2x+y+z,
$0.05 \leq x \leq 0.9$, $0.05 \leq y \leq 0.9$, $0 \leq z \leq 0.9$, $x+y+z=1$, $0.03 \leq e \leq 0.2$, and $0.03 \leq f \leq 0.25$,
R$^1$ may be a C1 to C6 alkyl group,
X may be a substituted or unsubstituted C6 to C30 aryl group, or a C3 to C30 heteroaryl group, and
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

The polysiloxane resin may be a condensation polymerization product of compounds represented by Chemical Formulae 2 to 4:

[Chemical Formula 2]

wherein, in Chemical Formula 2,
R$^2$ may be a C1 to C6 alkyl group, X may be a substituted or unsubstituted C6 to C30 aryl group, or a C3 to C30 heteroaryl group, and $0 \leq a \leq 3$,

[Chemical Formula 3]

wherein, in Chemical Formula 3,
R$^3$ may be a C1 to C6 alkyl group, and $0 \leq b \leq 4$, and

[Chemical Formula 4]

wherein, in Chemical Formula 4,
R$^4$ and R$^5$ each independently may be a C1 to C6 alkyl group,
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof, and
$0 \leq c \leq 3$ and $0 \leq d \leq 3$.

The compounds represented by Chemical Formulae 2 to 4 respectively may be hydrolyzed products of compounds represented by Chemical Formulae 5 to 7 under an acid catalyst or a base catalyst:

[Chemical Formula 5]

wherein, in Chemical Formula 5,
R$^2$ may be a C1 to C6 alkyl group, and X may be a substituted or unsubstituted C6 to C30 aryl group, or a C3 to C30 heteroaryl group,

[Chemical Formula 6]

wherein, in Chemical Formula 6, R$^3$ may be a C1 to C6 alkyl group, and

[Chemical Formula 7]

wherein, in Chemical Formula 7,
R$^4$ and R$^5$ each independently may be a C1 to C6 alkyl group, and
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

The compound represented by Chemical Formula 5 may be used in an amount of 0 to about 90 parts by weight, the compound represented by Chemical Formula 6 may be used in an amount of about 5 to about 90 parts by weight, the compound represented by Chemical Formula 7 may be used in an amount of about 5 to about 90 parts by weight, a sum of the compounds represented by Chemical Formulae 5 to 7 may be 100 parts by weight, the acid catalyst or base catalyst may be used in an amount of about 0.001 to about 5 parts by weight, and the solvent may be used in an amount of about 100 to about 900 parts by weight.

The polysiloxane resin may be included in an amount of about 1 to about 50 wt % based on a total amount of the photoresist underlayer composition.

The photoresist underlayer composition may further include an additive, and the additive may be a cross-linking agent, a radical stabilizer, a surfactant, a concentration controlling agent, or a combination thereof.

The solvent may include acetone, tetrahydrofuran, benzene, toluene, diethylether, dimethylether, dibutylether, methanol, ethanol, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, g-butyrolactone, or a combination thereof.

Embodiments are also directed towards a photoresist underlayer composition, including a solvent, and a polysiloxane resin including moieties represented by Chemical Formulae 1 and 8:

$$\{(SiO_{1.5}-Y-SiO_{1.5})_x(SiO_2)_y(XSiO_{1.5})_z\}(OH)_e(OR^1)_f \quad \text{[Chemical Formula 1]}$$

$$(R^6SiO_{1.5})_w \quad \text{[Chemical Formula 8]}$$

wherein:
w, x, y, and z respectively may denote a relative ratio of a $(R^6SiO_{1.5})_w$ repeating unit, a $(SiO_{1.5}-Y-SiO_{1.5})_x$ repeating unit, a $(SiO_2)_y$ repeating unit, and a $(XSiO_{1.5})_z$ repeating unit in the polysiloxane resin,
e and f respectively may denote a ratio of a —OH group and a —OR$^1$ group bonded to silicon atoms relative to a total number of silicon atoms in the polysiloxane resin, the total number of silicon atoms in the polysiloxane resin may be w+2x+y+z,
$0<w\leq 0.9$, $0.05\leq x\leq 0.9$, $0.05\leq y\leq 0.9$, $0\leq z\leq 0.9$, w+x+y+z=1, $0.03\leq e\leq 0.2$, and $0.03\leq f\leq 0.25$,
R$^1$ may be a C1 to C6 alkyl group,
R$^6$ may be a C1 to C12 alkyl group,
X may be a substituted or unsubstituted C6 to C30 aryl group, or a C3 to C30 heteroaryl group, and
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

The polysiloxane resin may be a condensation polymerization product of compounds represented by Chemical Formulae 2 to 4, and 9:

$$[HO]_a[R^2O]_{(3-a)}Si-X \quad \text{[Chemical Formula 2]}$$

wherein, in Chemical Formula 2,
R$^2$ may be a C1 to C6 alkyl group, X may be a substituted or unsubstituted C6 to C30 aryl group, or a C3 to C30 heteroaryl group, and $0\leq a\leq 3$, $$[HO]_b[R^3O]_{(4-b)}Si \quad \text{[Chemical Formula 3]}$$

wherein, in Chemical Formula 3,
R$^3$ may be a C1 to C6 alkyl group, and $$[HO]_c[R^4O]_{(3-c)}Si-Y-Si[OH]_d[OR^5]_{(3-d)} \quad \text{[Chemical Formula 4]}$$

wherein, in Chemical Formula 4,
R$^4$ and R$^5$ each independently may be a C1 to C6 alkyl group,
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof, and
$0\leq c\leq 3$ and $0\leq d\leq 3$, and $$[HO]_e[R^7O]_{(3-e)}Si-R^6 \quad \text{[Chemical Formula 9]}$$

wherein, in Chemical Formula 9,
R$^7$ may be a C1 to C6 alkyl group, R$^6$ may be a C1 to C12 alkyl group, and $0\leq e\leq 3$.

The compounds represented by Chemical Formulae 2 to 4, and 9 respectively may be hydrolyzed products of compounds represented by Chemical Formulae 5 to 7, and 10 under an acid catalyst or a base catalyst:

$$[R^2O]_3Si-X \quad \text{[Chemical Formula 5]}$$

wherein, in Chemical Formula 5,
R$^2$ may be a C1 to C6 alkyl group, and X may be a substituted or unsubstituted C6 to C30 aryl group, or a C3 to C30 heteroaryl group, $$[R^3O]_4Si \quad \text{[Chemical Formula 6]}$$

wherein, in Chemical Formula 6, R$^3$ may be a C1 to C6 alkyl group,

[Chemical Formula 7]

$$[R^4O]_3Si-Y-Si[OR^5]_3 \quad \text{[Chemical Formula 7]}$$

wherein, in Chemical Formula 7,
R$^4$ and R$^5$ each independently may be a C1 to C6 alkyl group, and
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof, and $$[R^7]_3Si-R^6 \quad \text{[Chemical Formula 10]}$$

wherein, in Chemical Formula 10,
R$^7$ may be a C1 to C6 alkyl group, and R$^6$ may be a C1 to C12 alkyl group.

Embodiments are also directed to a photoresist underlayer composition, including a solvent, and a polysiloxane resin produced by mixing a compound represented by Chemical Formula 5, a compound represented by Chemical Formula 6, and a Compound represented by Chemical Formula 7, and performing hydrolysis and condensation polymerization under an acid catalyst or a base catalyst:

$$[R^2O]_3Si-X \quad \text{[Chemical Formula 5]}$$

wherein, in Chemical Formula 5,
R$^2$ may be a C1 to C6 alkyl group, and X may be a substituted or unsubstituted C6 to C30 aryl group, or a C3 to C30 heteroaryl group, $$[R^3O]_4Si \quad \text{[Chemical Formula 6]}$$

wherein, in Chemical Formula 6, R$^3$ may be a C1 to C6 alkyl group, $$[R^4O]_3Si-Y-Si[OR^5]_3 \quad \text{[Chemical Formula 7]}$$

wherein, in Chemical Formula 7,
R$^4$ and R$^5$ each independently may be a C1 to C6 alkyl group, and
Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

The compounds represented by Chemical Formulae 5 to 7 may be further mixed with a compound represented by Chemical Formula 10:

[Chemical Formula 10]

wherein, in Chemical Formula 10, $R^7$ may be a C1 to C6 alkyl group, and $R^6$ may be a C1 to C12 alkyl group.

Embodiments are also directed to a method of manufacturing a semiconductor device, including forming a material layer, forming a first underlayer on the material layer, forming a second underlayer by applying and curing the photoresist underlayer composition according to an embodiment on the first underlayer, forming a photoresist layer on the second underlayer, patterning the photoresist layer to provide a first pattern, patterning the second underlayer using the first pattern as a mask to provide a second pattern, patterning a first underlayer using the second pattern as a mask to provide a third pattern, and patterning the material layer using the third pattern as a mask.

The method may further include forming an anti-reflection coating after forming the second underlayer and before forming the photoresist layer.

The first underlayer may include a carbon-based polymer resin.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, when a definition is not otherwise provided, the term "substituted" refers to one substituted with a hydroxyl group, a C1 to C6 alkyl group, or a C6 to C12 aryl group.

As used herein, when a definition is not otherwise provided, the term "aromatic ring group" refers to a C6 to C30 aryl group.

As used herein, when a definition is not otherwise provided, the term "alkyl" refers to a C1 to C6 alkyl group.

As used herein, when a definition is not otherwise provided, the term "heterocyclic group" refers to a C3 to C12 heteroaryl group, a C1 to C12 heterocycloalkyl group, a C2 to C12 heterocycloalkenyl group, a C2 to C12 heterocycloalkynyl group, or a fused ring thereof that includes a heteroatom of N, O, S, or P in one ring. The heterocyclic group may include 1 to 5 heteroatoms therein.

The photoresist underlayer composition according to an embodiment may include a polysiloxane resin represented by the following Chemical Formula 1, and a solvent.

[Chemical Formula 1]

In Chemical Formula 1, x, y, and z may respectively denote a relative ratio of a $(SiO_{1.5}-Y-SiO_{1.5})_x$ repeating unit, a $(SiO_2)_y$ repeating unit, and a $(XSiO_{1.5})_z$ repeating unit in the polysiloxane resin; e and f may respectively denote ratios of the numbers of a —OH group and a —$OR^1$ group bonded to silicon atoms relative to the total number of silicon atoms in the polysiloxane resin (2x+y+z); $0.05 \leq x \leq 0.9$, $0.05 \leq y \leq 0.9$, $0 \leq z \leq 0.9$, x+y+z=1, $0.03 \leq e \leq 0.2$, and $0.03 \leq f \leq 0.25$; $R^1$ may be a C1 to C6 alkyl group; and X may be a substituted or unsubstituted C6 to C30 aryl group, or a C3 to C30 heteroaryl group.

Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in the main chain; a C2 to C20 hydrocarbon group including a double or triple bond; or a combination thereof.

The polysiloxane resin represented by the above Chemical Formula 1 may be produced by mixing all monomers, each including a corresponding repeating unit, and performing a hydrolysis reaction. Because all the monomers are mixed prior to being subjected to the hydrolysis reaction, the ratio between the number of OH groups and the number of $OR^1$ groups in the resulting polysiloxane resin may be easily controlled by properly changing the acid or base catalyst, the solvent, or the like. In particular, using an appropriate reaction solvent in the hydrolysis reaction step makes it possible to synthesize the polysiloxane resin more stably by controlling a hydrolysis degree of an $OR^1$ group. These results are not obtainable for a composition prepared by subjecting each of the monomers to hydrolysis and condensation polymerization, respectively, and mixing resultant polymers, each of which has a different structure and different properties from the polysiloxane resin according to an embodiment.

Hereinafter, each component is described in greater detail.

The polysiloxane resin may be a condensation polymerization product of the compounds represented by the following Chemical Formulae 2 to 4.

[Chemical Formula 2]

In Chemical Formula 2, $R^2$ may be a C1 to C6 alkyl group, X may be a substituted or unsubstituted C6 to C30 aryl group, or a C3 to C30 heteroaryl group, and $0 \leq a \leq 3$.

[Chemical Formula 3]

In Chemical Formula 3, $R^3$ may be a C1 to C6 alkyl group, and $0 \leq b \leq 4$.

$$[HO]_c[R^4O]_{(3-c)}Si—Y—Si[OH]_d[OR^5]_{(3-d)} \quad \text{[Chemical Formula 4]}$$

In Chemical Formula 4, $R^4$ and $R^5$ each independently may be a C1 to C6 alkyl group;

Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in the main chain; a C2 to C20 hydrocarbon group including a double or triple bond; or a combination thereof; and $0 \leq c \leq 3$ and $0 \leq d \leq 3$.

The compounds represented by the above Chemical Formulae 2 to 4 respectively may be hydrolyzed products of the compounds represented by the following Chemical Formulae 5 to 7 under an acid catalyst or a base catalyst.

$$[R^2O]_3Si—X \quad \text{[Chemical Formula 5]}$$

In Chemical Formula 5, $R^2$ may be a C1 to C6 alkyl group, and X may be a substituted or unsubstituted C6 to C30 aryl group, or a C3 to C30 heteroaryl group.

$$[R^3O]_4Si \quad \text{[Chemical Formula 6]}$$

In Chemical Formula 6, $R^3$ may be a C1 to C6 alkyl group.

$$[R^4O]_3Si—Y—Si[OR^5]_3 \quad \text{[Chemical Formula 7]}$$

In Chemical Formula 7, $R^4$ and $R^5$ each independently may be a C1 to C6 alkyl group, and Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in the main chain; a C2 to C20 hydrocarbon group including a double or triple bond; or a combination thereof.

In an embodiment, the polysiloxane resin may include moieties represented by Chemical Formulae 1 and 8.

$$\{(SiO_{1.5}—Y—SiO_{1.5})_x(SiO_2)_y(XSiO_{1.5})_z\}(OH)_e(OR^1)_f \quad \text{[Chemical Formula 1]}$$

$$(R^6SiO_{1.5})_w \quad \text{[Chemical Formula 8]}$$

w, x, y, and z respectively may denote a relative ratio of a $(R^6SiO_{1.5})_w$ repeating unit, a $(SiO_{1.5}—Y—SiO_{1.5})_x$ repeating unit, a $(SiO_2)_y$ repeating unit, and a $(XSiO_{1.5})_z$ repeating unit in the polysiloxane resin; e and f respectively may denote a ratio of a —OH group and a —OR$^1$ group bonded to silicon atoms relative to a total number of silicon atoms in the polysiloxane resin (w+2x+y+z); $0 \leq w \leq 0.9$, $0.05 \leq x \leq 0.9$, $0.05 \leq y \leq 0.9$, $0 \leq z \leq 0.9$, $w+x+y+z=1$, $0.03 \leq e \leq 0.2$, and $0.03 \leq f \leq 0.25$; $R^1$ may be a C1 to C6 alkyl group; $R^6$ may be a C1 to C12 alkyl group; and X may be a substituted or unsubstituted C6 to C30 aryl group, or a C3 to C30 heteroaryl group.

Y may be a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

The polysiloxane resin may be a condensation polymerization product of the compounds represented by the above Chemical Formulae 2 to 4 and the compound represented by the following Chemical Formula 9.

$$[HO]_e[R^7O]_{(3-e)}Si—R^6 \quad \text{[Chemical Formula 9]}$$

In Chemical Formula 9, $R^7$ may be a C1 to C6 alkyl group, $R^6$ may be a C1 to C12 alkyl group, and $0 \leq e \leq 3$.

The compound represented by the above Chemical Formula 9 may be a hydrolyzed product of the compound represented by the following Chemical Formula 10.

$$[R^7O]_3Si—R^6 \quad \text{[Chemical Formula 10]}$$

In Chemical Formula 10, $R^7$ may be a C1 to C6 alkyl group, and $R^6$ may be a C1 to C12 alkyl group.

The polysiloxane resin may be prepared by mixing compounds represented by the above Chemical Formulae 5 to 7, and 10 in various ratios. For example, the compound represented by the above Chemical Formula 5 may be used in an amount of 0 to about 90 parts by weight, the compound represented by the above Chemical Formula 6 may be used in an amount of about 5 to about 90 parts by weight, and the compound represented by the above Chemical Formula 7 may be used in an amount of about 5 to about 90 parts by weight. Herein, the compounds represented by the above Chemical Formulae 5 to 7, and 10 may have a sum of 100 parts by weight. Furthermore, the acid catalyst or the base catalyst may be in an amount of about 0.001 to about 5 parts by weight, and the solvent may be in an amount of about 100 to about 900 parts by weight. In addition, the compound represented by the above Chemical Formula 10 may be in an amount of 0 to about 90 parts by weight. The polysiloxane resin may be in an amount of about 1 to about 50 wt% based on the total amount of the composition. The compound represented by the above Chemical Formula 5 may be used in an amount of about 1 to about 90 parts by weight, and the compound represented by the above Chemical Formula 10 may be used in an amount of about 1 to about 90 parts by weight.

The substituted or unsubstituted aromatic ring included in the compound represented by the above Chemical Formula 5 may show an absorption spectrum in a deep UV (DUV) region. Thus, a material with high anti-reflection characteristic may be prepared. An underlayer composition having a refractive index and an extinction coefficient at a particular wavelength may be provided by controlling the concentration ratio of a substituted or unsubstituted aromatic ring. When compounds represented by Chemical Formulae 5 to 7, and 10 have 100 parts by weight in total, the compound represented by the above Chemical Formula 5 may be used at up to about 90 parts by weight based on 100 parts by weight of the compounds represented by Chemical Formulae 5 to 7, and 10.

The substituted or unsubstituted aromatic ring included in the compound represented by the above Chemical Formula 5 may have an anti-reflection function, and thus an underlayer composition according to an embodiment may not need a separate anti-reflection coating (but may have an additional anti-reflection coating in order to improve absorbance, photo profile, and the like). When the compound represented by the above Chemical Formula 5 is used in an amount of up to about 90 parts by weight, Si may be more included, and thus improved etching selectivity may be secured. In addition, a compound represented by Chemical Formula 5 may be relatively controlled in an amount to have an appropriate anti-reflection characteristic. For example, when a compound represented by Chemical Formula 5 is included in an amount of about 10 parts by weight, k (extinction coefficient) may be about 0.2 at 193 nm.

When a compound represented by the above Chemical Formula 6 is relatively more included, silicon may be more included. When compounds represented by Chemical Formulae 5 to 7, and 10 have 100 parts by weight in total, the compound represented by the above Chemical Formula 6 may be used in an amount ranging from about 5 to about 90 parts by weight. When the compound represented by the above Chemical Formula 6 is used in an amount of about 5 parts or more by weight, the amount of silicon may be high enough to ensure a sufficient level of etching resistance. When the compound represented by the above Chemical Formula 6 is included in an amount of about 90 parts or less by weight, absorbance and storage stability may be improved.

When a compound represented by the above Chemical Formula 7 is relatively more included, etching resistance may be increased. When compounds represented by Chemical Formulae 5 to 7, and 10 have 100 parts by weight in total, the compound represented by the above Chemical Formula 7 may be included in an amount ranging from about 5 to about 90 parts by weight. When the compound represented by the above Chemical Formula 7 is used in an amount of about 5 parts or more by weight, the amount of silicon may be high enough to ensure a sufficient level of etching resistance. When the compound represented by the above Chemical Formula 7 is included in an amount of about 90 parts or less by weight, improved storage stability may be secured.

When a compound represented by the above Chemical Formula 10 is relatively more included, storage stability may increase. When compounds represented by Chemical Formulae 5 to 7, and 10 have 100 parts by weight in total, the compound represented by the above Chemical Formula 10 may be included in an amount ranging from 0 to about 90 parts by weight. When the compound represented by the above Chemical Formula 10 is included in an amount of about 90 parts or less by weight, an absorbance deterioration problem may be avoided.

The polysiloxane resin may be included in an amount of about 1 to about 50 parts by weight (preferably in an amount of about 1 to about 30 parts by weight) based on 100 parts by weight of the composition. When the polysiloxane resin is included in an amount of about 1 to about 50 parts by weight, a defective coating problem may be reduced.

The acid catalyst may include at least one selected from the group of inorganic acid (such as nitric acid, sulfuric acid, hydrochloric acid, and the like), and alkyl esters of organic sulfonic acids (such as p-toluenesulfonic acid monohydrate, diethylsulfate, and the like). The base catalyst may be at least one selected from the group of potassium hydroxide, an ammonium aqueous solution, tetramethylammonium hydroxide, cesium hydroxide, and the like.

The kind, amount, and injection method of the acid catalyst or the base catalyst may be controlled to appropriately regulate hydrolysis or condensation reaction during the resin synthesis. For example, the acid catalyst or the base catalyst may be included in an amount of about 0.001 to about 5 parts by weight in the organosilane-based polymerization reaction. When the catalyst is used in an amount of about 0.001 parts by weight or more, reaction rate may be increased. When the catalyst is used in an amount of about 5 parts by weight or less, the reaction rate may be such that a condensation polymerization product with a desired molecular weight may be obtained.

According to an embodiment, the composition may include a single solvent or a mixture of two or more solvents. At least one of the two or more solvents in the mixture may have a high boiling point. The solvent having a high boiling point may substantially prevent a void, and allows a film to dry more slowly, thereby improving flatness of the film. Herein, the "solvent having a high boiling point" may refer to a solvent that volatilizes at a temperature slightly lower than a temperature at which the composition according to an embodiment is coated, dried, and solidified (e.g., 200° C.). Examples of the solvent include acetone, tetrahydrofuran, benzene, toluene, diethylether, dimethylether, dibutylether, methanol, ethanol, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, g-butyrolactone, and the like. These solvents may be used alone or as mixture of two or more. In addition, the solvent may be used as a reaction solvent during the hydrolysis reaction before forming a condensation polymerization product. The reaction solvent may be the same as the solvent in the composition or different from the solvent in the composition.

The composition may further include an additive as needed. The additive may include one or more of a cross-linking agent, a radical stabilizer, a surfactant, and the like.

The composition may further include at least one compound selected from the group of sulfonate salts of organic base (such as pyridinium p-toluenesulfonate, amidosulfobetain-16, ammonium (–)-camphor-10-sulfonic acid ammonium salt, and the like), ammonium formate, triethylammonium formate, trimethyammonium formate, tetramethylammonium formate, pyridinium formate, tetrabutylammonium formate, tetramethylammonium nitrate, and the like. The compound may promote cross-linking of a resin (e.g., as a cross-linking catalyst), and thus etching resistance and solvent-resistance may be improved. The compound may be used in an amount ranging from about 0.0001 to about 0.01 parts by weight based on 100 parts by weight of the polysiloxane resin. When the compound is used in an amount of about 0.0001 parts by weight or more, a desired effect (e.g., cross-linking promotion) may be achieved. When the compound is used in an amount of about 0.01 parts by weight or less, storage stability may be improved.

The photoresist underlayer composition according to an embodiment may include a polysiloxane resin obtained by subjecting the compounds represented by the above Chemical Formulae 5 to 7 to hydrolysis and condensation polymerization under an acid catalyst or a base catalyst, and a solvent.

The polysiloxane resin may be produced by mixing the compounds represented by the above Chemical Formulae 5 to 7 with the compound represented by the above Chemical Formula 10, and subjecting them to hydrolysis and condensation polymerization.

The compounds represented by the above Chemical Formulae 5 to 7, and 10 may be hydrolyzed as a mixture in the reaction solvent. Thus, the compounds represented by the above Chemical Formulae 2 to 4, and 9 may be respectively produced. Next, the hydrolyzed products may undergo a condensation polymerization, thereby preparing a polysiloxane resin.

Details related to Chemical Formulae 1-10 are discussed above and will not be repeated.

According to an embodiment, a method of manufacturing a semiconductor device may include forming a material layer; forming a first underlayer on the material layer; forming a second underlayer by applying and curing the photoresist underlayer composition according to an embodiment on the first underlayer; forming a photoresist layer on the second underlayer; patterning the photoresist layer to provide a first pattern; patterning the second underlayer using the first pattern as a mask to provide a second pattern; patterning a first underlayer using the second pattern as a mask to provide a third pattern; and patterning the material layer using the third pattern as a mask.

After forming the second underlayer and before forming the photoresist layer, an anti-reflection coating may be further formed.

The first underlayer may include a carbon-based polymer resin.

An exemplary method of manufacturing a semiconductor device will now be discussed. First, a material layer to be patterned (such as aluminum, silicon nitride, and the like) may be formed on a silicon substrate. The formation may be performed by a suitable method of deposition (such as vapor deposition, spin coating, and the like).

Figure 1:
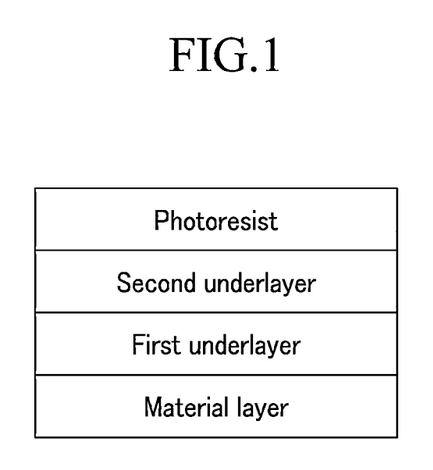
FIG. 1 illustrates a schematic cross-sectional view of a semiconductor device during a manufacturing process of a semiconductor device according to an embodiment.
Figure 2:
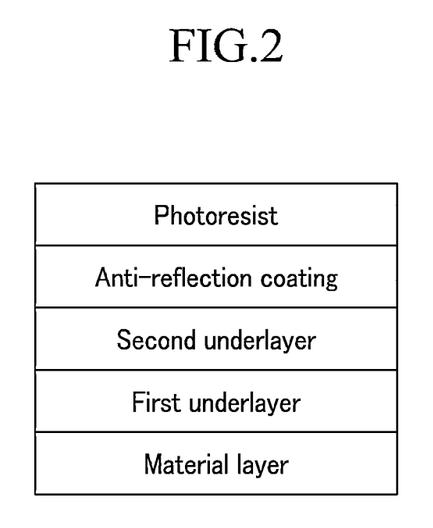
FIG. 2 illustrates a schematic cross-sectional view of a semiconductor device during a manufacturing process of a semiconductor device according to an embodiment.

FIGS. 1 and 2 illustrate schematic cross-sectional views of a semiconductor device during a manufacturing process of a semiconductor device according to an embodiment.

Referring to FIGS. 1 and 2, the material to be patterned may be, e.g., an electrically conductive, semi-conductive, magnetic, or insulating material. Then, a carbon-based polymer resin composition may be spin-coated to be about 500 Å to about 4000 Å thick to form a first underlayer, and may be baked at about 100° C. to about 300° C. for about 10 seconds to about 10 minute to cure a first underlayer. Next, a composition according to an embodiment may be spin-coated to be about 500 Å to about 4000 Å thick on the first underlayer to form a second underlayer, and may be baked at about 100° C. to about 300° C. for about 10 seconds to about 10 minutes to cure a second underlayer. The second underlayer may be treated with an anti-reflective coating (ARC), but this may not be necessary. On the second underlayer, a photoresist layer (a radiation-sensitive imaging layer) may be laminated.

Then, a first pattern may be formed on the photoresist layer through exposure and development processes. Herein, the second underlayer may be exposed to a light. The exposed second underlayer may be wet-etched (or dry-etched) by using $CHF_3/CF_4$ mixed gas and the like to form a second pattern. Next, the exposed first underlayer may be etched by using $BCl_3/Cl_2$ mixed gas and the like to form a third pattern thereon. Likewise, the exposed material layer may be wet-etched for patterning by using $CHF_3/CF_4$ mixed gas and the like. Once the material layer is patterned, a remaining film may be removed by plasma using oxygen and the like. Accordingly, such a patterned material layer may be used in the fabrication and design of a semiconductor device. For example, the composition may be used in the formation of patterned material layer structures such as a metal line, holes for contacts and biases, insulating sections, damascene trenches (DTs), shallow trench isolations (STIs), trenches for capacitor structures, and the like.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

COMPARATIVE EXAMPLE 1

1264 g of tetraethylorthosilicate, 134 g of phenyltrimethoxysilane, and 2.4 g of bistriethoxysilylethane were dissolved in 5600 g of propylene glycol monomethyl ether acetate in a 10 L 4-necked flask including a mechanical agitator, a condenser, a dropping funnel, and a nitrogen gas injection tube, and 1186 g of a 0.5% nitric acid aqueous solution was added thereto. Then, the mixed solution was reacted at 60° C. for 1 hour and then, applied with a negative pressure to remove methanol and ethanol produced therein. The reaction solution formed many particles, and thus was not considered to have acceptable properties.

EXAMPLE 1

1264 g of tetraethylorthosilicate, 134 g of phenyltrimethoxysilane, and 2.4 g of bistriethoxysilylethane were dissolved in 5600 g of dibutylether in a 10 L 4-necked flask including a mechanical agitator, a condenser, a dropping funnel, and a nitrogen gas injection tube, and 1186 g of a 0.5% nitric acid aqueous solution was added thereto. Then, the mixed solution was reacted at 60° C. for 1 hour and applied with a negative pressure to remove methanol and ethanol produced therein. The resulting product was maintained at 60° C. and reacted for 2 days, preparing a condensation polymerization product represented by the following Chemical Formula 11.

[Chemical Formula 11]

$(0.03 \leq a \leq 0.2, 0.03 \leq b \leq 0.25, 0.03 \leq c \leq 0.25)$

In Chemical Formula 11, Me is a methyl group, Et is an ethyl group, and Ph is a phenyl group.

Next, 80 g of propylene glycol monomethyl ether acetate was added to 20 g of the polymer solution to dilute the solution. 0.004 g of pyridinium p-toluenesulfonate was added to the diluted solution, thereby preparing an underlayer composition. The underlayer composition was spin-coated and baked at 240° C. for 60 seconds to form a 800 Å-thick film on a silicon wafer.

EXAMPLE 2

559 g of tetraethylorthosilicate, 139 g of phenyltrimethoxysilane, 702 g of bistriethoxysilylethane were dissolved in 5600 g of dibutylether in a 10 L 4-necked flask including a mechanical agitator, a condenser, a dropping funnel, and a nitrogen gas injection tube, and 1113 g of a 0.5% nitric acid aqueous solution was added thereto. Then, the mixed solution was reacted at 60° C. for 1 hour and applied with a negative pressure to remove methanol and ethanol produced therein. The resulting product was maintained at 60° C. and reacted for 6 days, preparing a condensation polymerization product represented by the following Chemical Formula 12.

[Chemical Formula 12]

$(0.03 \leq a \leq 0.2, 0.03 \leq b \leq 0.25, 0.03 \leq c \leq 0.25)$ 80 g of propylene glycol monomethyl ether acetate was added to 20 g of the polymer solution to dilute the solution. 0.004 g of pyridinium p-toluenesulfonate was added to this diluted solution, thereby preparing an underlayer composition. The underlayer composition was spin-coated and baked at 240° C. for 60 seconds to form a 800 Å-thick film on a silicon wafer.

EXPERIMENTAL EXAMPLE 1

The solutions according to Comparative Example 1 and Examples 1 to 2 were evaluated regarding stability. While being stored at 40° C., the state of each solution was observed and changes in the coating thickness thereof were determined. The results are provided in the following Table 1.

TABLE 1

| | Thickness |
|---|---|
| Comparative Example 1 | particles being generated |
| Example 1 | 10 Å or less |
| Example 2 | 10 Å or less |

In the case of the compositions according to Examples 1 and 2, the molecular weights of the polymers as prepared were maintained even after a certain period of time and there was little change in thickness, e.g., less than 10 Å. These results confirmed that the compositions had an excellent level of storage stability. On the contrary, the composition of Comparative Example 1 had some particles being generated during the reaction (i.e., became a gel).

EXPERIMENTAL EXAMPLE 2

Refractive index (n) and extinction coefficient (k) of the films according to Examples 1 and 2 were measured by using an ellipsometer (J. A. Woollam Co., Inc.). The results are provided in the following Table 2. As aforementioned, the composition according to Comparative Example 1 became a gel and failed to form a film (which also applies to the following Experimental Examples 3 to 6).

TABLE 2

| | Optical property (193 nm) | |
|---|---|---|
| | n (refractive index) | k (extinction coefficient) |
| Comparative Example 1 | — | — |
| Example 1 | 1.72 | 0.23 |
| Example 2 | 1.72 | 0.21 |

As shown in Examples 1 to 2, a material with a high level of anti-reflection characteristic may be prepared. This may be because a substituted or unsubstituted aromatic ring shows an absorption spectrum in a deep UV (DUV) region.

EXPERIMENTAL EXAMPLE 3

The contact angles of the films according to Examples 1 to 2 were measured by using DAS-100 (Kruss Co.). The contact angle was measured by dropping 3 μl of water on each surface of the film by 5 point, and then measuring an angle of the water drop against the surface. The results are provided in the following Table 3.

TABLE 3

| | Contact angle |
|---|---|
| Comparative Example 1 | — |
| Example 1 | 51.6° |
| Example 2 | 58.6° |

As shown in Table 3, a polymer may be easily synthesized to have a desired surface characteristic by controlling a feeding ratio of Chemical Formulae 5 to 7. In particular, each surface of the films had a relatively hydrophilic characteristic.

EXPERIMENTAL EXAMPLE 4

The wafers according to Examples 1 to 2 were dry-etched for 15 seconds under a condition of 60 mTorr, 270 W/0 W, 20 $N_2$, 40 $O_2$, and 200 Ar, and then measured regarding a thickness to calculate an etching rate per unit time. The results are provided in the following Table 4.

TABLE 4

| | Etching rate (Å/sec) |
|---|---|
| Comparative Example 1 | — |
| Example 1 | 3.04 |
| Example 2 | 6.01 |

The wafers according to Examples 1 and 2 all had excellent etching resistance against $O_2$ plasma. In addition, as Si was more included, the etching resistance against $O_2$ plasma increased.

EXPERIMENTAL EXAMPLE 5

A first underlayer was formed by coating and curing a naphthyl-based carbon polymer on a material layer. Next, a second underlayer was formed by coating and curing the compositions according to Examples 1 to 2. Then, an ArF photoresist was coated thereon and baked at 110° C. for 60 seconds. The resulting product was exposed to a light by using an ArF exposure equipment, ASML1250 (NA 0.82), and then, developed with a 2.38 wt % tetramethyl ammonium hydroxide aqueous solution.

Then, a CD-SEM was used to examine a 70 nm/70 nm line and space pattern. Based on the result, the wafers were measured regarding EL (exposure latitude) depending on an exposure dose and DoF (depth of focus) depending on a distance from a light source. The result is provided in the following Table 5.

TABLE 5

| | Pattern Property | |
|---|---|---|
| | EL (nm/mJ) | DoF (μm) |
| Comparative Example 1 | — | — |
| Example 1 | 3.0 | ≤0.3 |
| Example 2 | 3.0 | ≤0.3 |

The wafers according to Examples 1 to 2 all had good pattern characteristics in terms of the EL and DoF.

EXPERIMENTAL EXAMPLE 6

Figure 3:
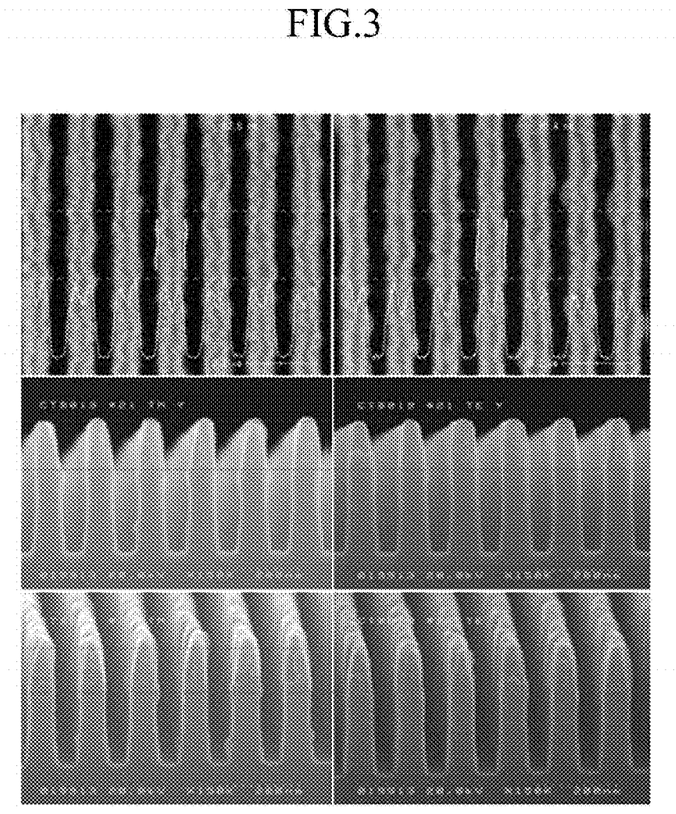
FIG. 3 illustrates a FE-SEM image of a semiconductor device according to an embodiment.

In the specimens having a patterned photoresist according to Experimental Example 5, first and second underlayers were sequentially exposed to a light, developed, and etched to pattern a material layer. Then, the specimens were examined regarding cross-section with a FE-SEM. In FIG. 3, the FE-SEM images on the left side correspond to the specimen according to Example 1, and the FE-SEM images on the right side correspond to the specimen according to Example 2. As shown in FIG. 3, the material layer had a desired pattern shape and size transferred from the patterned photoresist.

By way of summary and review, if a fine circuit for a semiconductor has a narrow line width, a photoresist may be required to be thinner due to the aspect ratio of a pattern. However, when a photoresist is too thin, it may not work as a mask during the photolithography process. In other words, the photoresist may be all consumed during the etching, and thus a material layer may not be etched down to a desired depth.

Accordingly, an underlayer may be introduced under the photoresist in to solve this problem. The underlayer may be made of a material with excellent etching selectivity and may include two layers. A first underlayer may be carbon-based and may be formed on a material layer to be patterned, and a second underlayer may be silicon-based and may be formed on the first underlayer. Finally, a photoresist may be coated on the second underlayer. The silicon-based second underlayer may have a higher etching selectivity for a photoresist than the material layer, and thus it may easily transfer a pattern from even a thin photoresist. Then, the pattern-transferred silicon-based second underlayer may be used as a mask, and the carbon-based first underlayer may be etched and a pattern may be transferred. Then, the carbon-based first underlayer may be used as a mask and a pattern may be transferred to a material layer. Therefore, a second underlayer having a higher etching selectivity may allow a thinner photoresist to be used to etch a material layer to a desired depth.

An underlayer may be formed in a chemical vapor deposition (CVD) method during the production of a semiconductor. However, the CVD method may produce particles inside a thin film. In addition, these particles may have a detrimental influence on characteristics of a semiconductor device, e.g., if the semiconductor device has a fine circuit therein with a narrower line width. The CVD process may take a long time to deposit a thin film, and thus the CVD process may have a problem of throughput deterioration and expensive equipment. In order to solve this problem, an underlayer composition applicable as spin-on-coating may be desired. The spin-on-coating may easily control particles, have a fast process, and use a conventional coater, and thus may result in reduced cost.

When a silicone resin is used to manufacture an underlayer, it may have to contain a large amount of silicon for a high level of etch selectivity. To this end, the silicone resin may be prepared from a highly reactive monomer, which may make the silicone resin more difficult to synthesize and also brings about problems in coating property, storage stability, and the like when the resin is to be prepared as an actual product.

The photoresist underlayer composition according to an embodiment may be applicable as spin-on-coating, may have excellent storage stability and etching resistance, and may be capable of adjusting surface properties and forming a stable photoresist pattern. The photoresist underlayer composition according to an embodiment may include a relatively increased amount of silicon, and thus may increase etching selectivity, thereby providing a underlayer that allows a thinner photoresist to be used to etch a material layer to a desired depth.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photoresist underlayer composition, comprising:
a solvent; and
a polysiloxane resin represented by Chemical Formula 1:

[Chemical Formula 1]

wherein, in Chemical Formula 1:
x, y, and z respectively denote a relative ratio of a $(SiO_{1.5}-Y-SiO_{1.5})_x$ repeating unit, a $(SiO_2)_y$ repeating unit, and a $(XSiO_{1.5})_z$ repeating unit in the polysiloxane resin,
e and f respectively denote a ratio of a —OH group and a —$OR^1$ group bonded to silicon atoms relative to a total number of silicon atoms in the polysiloxane resin, the total number of silicon atoms in the polysiloxane resin being 2x+y+z,
$0.05 \leq x \leq 0.9$, $0.05 \leq y \leq 0.9$, $0 \leq z \leq 0.9$, x+y+z=1, $0.03 \leq e \leq 0.2$, and $0.03 \leq f \leq 0.25$,
$R^1$ is a C1 to C6 alkyl group,
X is a substituted or unsubstituted C6 to C30 aryl group, or a C3 to C30 heteroaryl group, and
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic moiety, a urea moiety, an isocyanurate moiety, or a combination thereof in a main chain; a C2 to C20 hydrocarbon group including a double or triple bond; or a combination thereof.

2. The photoresist underlayer composition as claimed in claim 1, wherein the polysiloxane resin is a condensation polymerization product of compounds represented by Chemical Formula 2 to 4:

[Chemical Formula 2]

wherein, in Chemical Formula 2,
$R^2$ is a C1 to C6 alkyl group, X is a substituted or unsubstituted C6 to C30 aryl group, or a C3 to C30 heteroaryl group, and $0 \leq a \leq 3$,

[Chemical Formula 3]

wherein, in Chemical Formula 3,
$R^3$ is a C1 to C6 alkyl group, and $0 \leq b \leq 4$, and

[Chemical Formula 4]

wherein, in Chemical Formula 4,
$R^4$ and $R^5$ are each independently a C1 to C6 alkyl group,
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic moiety, a urea moiety, an isocyanurate moiety, or a combination thereof in a main chain; a C2 to C20 hydrocarbon group including a double or triple bond; or a combination thereof, and
$0 \leq c \leq 3$ and $0 \leq d \leq 3$.

3. The photoresist underlayer composition as claimed in claim 2, wherein the compounds represented by Chemical Formulae 2 to 4 are respectively hydrolyzed products of compounds represented by Chemical Formulae 5 to 7 under an acid catalyst or a base catalyst:

[Chemical Formula 5]

wherein, in Chemical Formula 5,
$R^2$ is a C1 to C6 alkyl group, and X is a substituted or unsubstituted C6 to C30 aryl group, or a C3 to C30 heteroaryl group,

[Chemical Formula 6]

wherein, in Chemical Formula 6, R3 is a C1 to C6 alkyl group, and $$[R^4O]_3Si—Y—Si[OR^5]_3 \quad \text{[Chemical Formula 7]}$$

wherein, in Chemical Formula 7,
$R^4$ and $R^5$ are each independently a C1 to C6 alkyl group, and
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

4. The photoresist underlayer composition as claimed in claim 1, wherein the polysiloxane resin is included in an amount of about 1 to about 50 wt % based on a total amount of the photoresist underlayer composition.

5. The photoresist underlayer composition as claimed in claim 1, wherein the photoresist underlayer composition further comprises an additive, and the additive is a cross-linking agent, a radical stabilizer, a surfactant, a concentration controlling agent, or a combination thereof.

6. The photoresist underlayer composition as claimed in claim 1, wherein the solvent includes acetone, tetrahydrofuran, benzene, toluene, diethylether, dimethylether, dibutylether, methanol, ethanol, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, g-butyrolactone, or a combination thereof.

7. A photoresist underlayer composition, comprising:
a solvent; and
a polysiloxane resin including moieties represented by Chemical Formulae 1 and 8:

$$\{(SiO_{1.5}—Y—SiO_{1.5})_x(SiO_2)_y(XSiO_{1.5})_z\}(OH)_e(OR^1)_f \quad \text{[Chemical Formula 1]}$$

$$(R^6SiO_{1.5})_w \quad \text{[Chemical Formula 8]}$$

wherein:
w, x, y, and z respectively denote a relative ratio of a $(R^6SiO_{1.5})_w$ repeating unit, a $(SiO_{1.5}—Y—SiO_{1.5})_x$ repeating unit, a $(SiO_2)_y$ repeating unit, and a $(XSiO_{1.5})_z$ repeating unit in the polysiloxane resin,
e and f respectively denote a ratio of a —OH group and a —OR$^1$ group bonded to silicon atoms relative to a total number of silicon atoms in the polysiloxane resin, the total number of silicon atoms in the polysiloxane resin being w+2x+y+z,
$0<w\leq0.9, 0.05\leq x\leq0.9, 0.05\leq y\leq0.9, 0\leq z\leq0.9, w+x+y+z=1, 0.03\leq e\leq0.2$, and $0.03\leq f\leq0.25$,
$R^1$ is a C1 to C6 alkyl group,
$R^6$ is a C1 to C12 alkyl group,
X is a substituted or unsubstituted C6 to C30 aryl group, or a C3 to C30 heteroaryl group, and
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

8. The photoresist underlayer composition as claimed in claim 7, wherein the polysiloxane resin is a condensation polymerization product of compounds represented by Chemical Formulae 2 to 4, and 9:

$$[HO]_a[R^2O]_{(3-a)}Si—X \quad \text{[Chemical Formula 2]}$$

wherein, in Chemical Formula 2,
$R^2$ is a C1 to C6 alkyl group, X is a substituted or unsubstituted C6 to C30 aryl group, or a C3 to C30 heteroaryl group, and $0\leq a\leq3$, $$[HO]_b[R^3O]_{(4-b)}Si \quad \text{[Chemical Formula 3]}$$

wherein, in Chemical Formula 3,
$R^3$ is a C1 to C6 alkyl group, and $0\leq b\leq4$, $$[HO]_c[R^4O]_{(3-c)}Si—Y—Si[OH]_d[OR^5]_{(3-d)} \quad \text{[Chemical Formula 4]}$$

wherein, in Chemical Formula 4,
$R^4$ and $R^5$ are each independently a C1 to C6 alkyl group,
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof, and
$0\leq c\leq3$ and $0\leq d\leq3$, and $$[HO]_e[R^7O]_{(3-e)}Si—R^6 \quad \text{[Chemical Formula 9]}$$

wherein, in Chemical Formula 9,
$R^7$ is a C1 to C6 alkyl group, $R^6$ is a C1 to C12 alkyl group, and $0\leq e\leq3$.

9. The photoresist underlayer composition as claimed in claim 8, wherein the compounds represented by Chemical Formulae 2 to 4, and 9 are respectively hydrolyzed products of compounds represented by Chemical Formulae 5 to 7, and 10 under an acid catalyst or a base catalyst:

$$[R^2O]_3Si—X \quad \text{[Chemical Formula 5]}$$

wherein, in Chemical Formula 5,
$R^2$ is a C1 to C6 alkyl group, and X is a substituted or unsubstituted C6 to C30 aryl group, or a C3 to C30 heteroaryl group, $$[R^3O]_4Si \quad \text{[Chemical Formula 6]}$$

wherein, in Chemical Formula 6, $R^3$ is a C1 to C6 alkyl group, $$[R^4O]_3Si—Y—Si[OR^5]_3 \quad \text{[Chemical Formula 7]}$$

wherein, in Chemical Formula 7,
$R^4$ and $R^5$ are each independently a C1 to C6 alkyl group, and
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof, and $$[R^7O]_3Si—R^6 \quad \text{[Chemical Formula 10]}$$

wherein, in Chemical Formula 10,
$R^7$ is a C1 to C6 alkyl group, and $R^6$ is a C1 to C12 alkyl group.

10. A photoresist underlayer composition, comprising:
a solvent; and
a polysiloxane resin including $(OH)_e(OR^1)_f$ where e and f respectively denote a ratio of a —OH group and a —OR$^1$ group bonded to silicon atoms relative to a total number of silicon atoms in the polysiloxane resin, and $0.03 \le e \le 0.2$, and $0.03 \le f \le 0.25$,
wherein the polysiloxane resin is produced by:
mixing a compound represented by Chemical Formula 5, a compound represented by Chemical Formula 6, and a Compound represented by Chemical Formula 7, and
performing hydrolysis and condensation polymerization under an acid catalyst or a base catalyst:

$$[R^2O]_3Si-X \quad \text{[Chemical Formula 5]}$$

wherein, in Chemical Formula 5,
$R^2$ is a C1 to C6 alkyl group, and X is a substituted or unsubstituted C6 to C30 aryl group, or a C3 to C30 heteroaryl group, $$[R^3O]_4Si \quad \text{[Chemical Formula 6]}$$

wherein, in Chemical Formula 6, R3 is a C1 to C6 alkyl group, $$[R^4O]_3Si-Y-Si[OR^5]_3 \quad \text{[Chemical Formula 7]}$$

wherein, in Chemical Formula 7,
$R^4$ and $R^5$ are each independently a C1 to C6 alkyl group, and
Y is a substituted or unsubstituted C6 to C30 arylene group; a C3 to C30 heteroarylene group; a linear or branched substituted or unsubstituted C1 to C20 alkylene group; a C1 to C20 alkylene group including an aromatic ring moiety, a heterocyclic ring moiety, a urea moiety, an isocyanurate moiety, or a combination thereof in a main chain; a C2 to C20 hydrocarbon group including a double or triple bond; or a combination thereof.

11. The photoresist underlayer composition as claimed in claim 10, wherein the compounds represented by Chemical Formulae 5 to 7 are further mixed with a compound represented by Chemical Formula 10:

$$[R^7O]_3Si-R^6 \quad \text{[Chemical Formula 10]}$$

wherein, in Chemical Formula 10,
$R^7$ is a C1 to C6 alkyl group, and $R^6$ is a C1 to C12 alkyl group.

12. A method of manufacturing a semiconductor device, comprising:
forming a material layer;
forming a first underlayer on the material layer;
forming a second underlayer by applying and curing the photoresist underlayer composition as claimed in claim 1 on the first underlayer;
forming a photoresist layer on the second underlayer;
patterning the photoresist layer to provide a first pattern;
patterning the second underlayer using the first pattern as a mask to provide a second pattern;
patterning a first underlayer using the second pattern as a mask to provide a third pattern; and
patterning the material layer using the third pattern as a mask.

13. The method as claimed in claim 12, further comprising forming an anti-reflection coating after forming the second underlayer and before forming the photoresist layer.

14. The method as claimed in claim 12, wherein the first underlayer includes a carbon-based polymer resin.

15. The photoresist underlayer composition as claimed in claim 3, wherein the compounds represented by Chemical Formulae 2 to 4 are respectively hydrolyzed products of compounds represented by Chemical Formulae 5 to 7 under an acid catalyst or a base catalyst and a solvent comprising dibutylether.

* * * * *